US007111220B1

(12) United States Patent  
Sasaki et al.

(10) Patent No.: US 7,111,220 B1
(45) Date of Patent: Sep. 19, 2006

(54) NETWORK PHYSICAL LAYER WITH EMBEDDED MULTI-STANDARD CRC GENERATOR

(75) Inventors: Paul T. Sasaki, Sunnyvale, CA (US); Suresh M. Menon, Sunnyvale, CA (US); Atul V. Ghia, San Jose, CA (US); Warren E. Cory, Redwood City, CA (US); Hare K. Verma, Cupertino, CA (US); Philip M. Freidin, Sunnyvale, CA (US)

(73) Assignee: Xilinx, Inc., San Jose, CA (US)

( * ) Notice: Subject to any disclaimer, the term of this patent is extended or adjusted under 35 U.S.C. 154(b) by 533 days.

(21) Appl. No.: 10/090,519

(22) Filed: Mar. 1, 2002

(51) Int. Cl.
*H03M 13/00* (2006.01)

(52) U.S. Cl. .................................................. 714/753

(58) Field of Classification Search ............... 714/753, 714/807, 808; 370/445, 463, 473, 537; 341/59, 341/58; 710/126, 65; 709/248, 236; 340/347
See application file for complete search history.

(56) References Cited

U.S. PATENT DOCUMENTS

| | | | |
|---|---|---|---|
| 4,486,739 A | * | 12/1984 | Franaszek et al. ............ 341/59 |
| 4,758,985 A | | 7/1988 | Carter |
| 4,855,669 A | | 8/1989 | Mahoney |
| 5,072,418 A | | 12/1991 | Boutaud et al. |
| 5,142,625 A | | 8/1992 | Nakai |
| RE34,363 E | | 8/1993 | Freeman |
| 5,274,570 A | | 12/1993 | Izumi et al. |
| 5,311,114 A | | 5/1994 | Sambamurthy et al. |
| 5,339,262 A | | 8/1994 | Rostoker et al. |
| 5,347,181 A | | 9/1994 | Ashby et al. |
| 5,361,373 A | | 11/1994 | Gilson |
| 5,457,410 A | | 10/1995 | Ting |
| 5,473,267 A | | 12/1995 | Stansfield |
| 5,500,943 A | | 3/1996 | Ho et al. |
| 5,504,738 A | | 4/1996 | Sambamurthy et al. |
| 5,537,601 A | | 7/1996 | Kimura et al. |
| 5,543,640 A | | 8/1996 | Sutherland et al. |
| 5,550,782 A | | 8/1996 | Cliff et al. |
| 5,552,722 A | | 9/1996 | Kean |
| 5,574,930 A | | 11/1996 | Halverson, Jr. et al. |
| 5,574,942 A | | 11/1996 | Colwell et al. |
| 5,581,745 A | | 12/1996 | Muraoka |
| 5,600,845 A | | 2/1997 | Gilson |
| 5,652,904 A | | 7/1997 | Trimberger |

(Continued)

FOREIGN PATENT DOCUMENTS

DE    EP-0676697 A1 *  3/1995

(Continued)

OTHER PUBLICATIONS

Phung et al., Sudy of SONET STS-3c based ATM User Network Interface Design, Oct. 1, 1993, IEEE, pp. 366-369.*

(Continued)

*Primary Examiner*—Albert Decady
*Assistant Examiner*—John J. Tabone, Jr.
(74) *Attorney, Agent, or Firm*—Arthur Joseph Behiel; John J. King (57) ABSTRACT

Disclosed are methods and structures for preparing data for transmission over a network. In an embodiment consistent with the OSI network model, transmit and receive CRC generators are moved from the link layer to the physical layer, which frees up valuable programmable logic resources when a programmable logic device is employed to perform the functions of the link layer. The CRC generators of the physical layer comply with a plurality of network communication standards.

45 Claims, 6 Drawing Sheets

U.S. PATENT DOCUMENTS

| | | | |
|---|---|---|---|
| 5,671,355 A | 9/1997 | Collins | |
| 5,705,938 A | 1/1998 | Kean | |
| 5,732,250 A | 3/1998 | Bates et al. | |
| 5,737,631 A | 4/1998 | Trimberger | |
| 5,740,404 A | 4/1998 | Baji | |
| 5,742,179 A | 4/1998 | Sasaki | |
| 5,742,180 A | 4/1998 | DeHon et al. | |
| 5,748,979 A | 5/1998 | Trimberger | |
| 5,752,035 A | 5/1998 | Trimberger | |
| 5,760,607 A | 6/1998 | Leeds et al. | |
| 5,809,517 A | 9/1998 | Shimura | |
| 5,835,405 A | 11/1998 | Tsui et al. | |
| 5,874,834 A | 2/1999 | New | |
| 5,889,788 A | 3/1999 | Pressly et al. | |
| 5,892,961 A | 4/1999 | Trimberger | |
| 5,914,616 A | 6/1999 | Young et al. | |
| 5,914,902 A | 6/1999 | Lawrence et al. | |
| 5,933,023 A | 8/1999 | Young | |
| 5,970,254 A | 10/1999 | Cooke et al. | |
| 6,011,407 A | 1/2000 | New | |
| 6,020,755 A | 2/2000 | Andrews et al. | |
| 6,026,481 A | 2/2000 | New et al. | |
| 6,094,439 A * | 7/2000 | Krishna et al. | 370/445 |
| 6,096,091 A | 8/2000 | Hartmann | |
| 6,154,051 A | 11/2000 | Nguyen et al. | |
| 6,163,166 A | 12/2000 | Bielby et al. | |
| 6,172,990 B1 | 1/2001 | Deb et al. | |
| 6,178,541 B1 | 1/2001 | Joly et al. | |
| 6,181,163 B1 | 1/2001 | Agrawal et al. | |
| 6,211,697 B1 | 4/2001 | Lien et al. | |
| 6,242,945 B1 | 6/2001 | New | |
| 6,272,451 B1 | 8/2001 | Mason et al. | |
| 6,279,045 B1 | 8/2001 | Muthujumaraswathy et al. | |
| 6,282,627 B1 | 8/2001 | Wong et al. | |
| 6,295,626 B1 | 9/2001 | Nair et al. | |
| 6,301,696 B1 | 10/2001 | Lien et al. | |
| 6,343,207 B1 | 1/2002 | Hessel et al. | |
| 6,353,331 B1 | 3/2002 | Shimanek | |
| 6,356,987 B1 | 3/2002 | Aulas | |
| 6,389,558 B1 | 5/2002 | Herrmann et al. | |
| 6,418,494 B1 * | 7/2002 | Shatas et al. | 710/305 |
| 6,434,735 B1 | 8/2002 | Watkins | |
| 6,460,172 B1 | 10/2002 | Insenser Farre et al. | |
| 6,467,009 B1 | 10/2002 | Winegarden et al. | |
| 6,483,342 B1 | 11/2002 | Britton et al. | |
| 6,507,942 B1 | 1/2003 | Calderone et al. | |
| 6,510,548 B1 | 1/2003 | Squires | |
| 6,518,787 B1 | 2/2003 | Allegrucci et al. | |
| 6,519,753 B1 | 2/2003 | Ang | |
| 6,522,167 B1 | 2/2003 | Ansari et al. | |
| 6,532,572 B1 | 3/2003 | Tetelbaum | |
| 6,539,508 B1 | 3/2003 | Patrie et al. | |
| 6,541,991 B1 | 4/2003 | Hornchek et al. | |
| 6,578,174 B1 | 6/2003 | Zizzo | |
| 6,587,995 B1 | 7/2003 | Duboc et al. | |
| 6,588,006 B1 | 7/2003 | Watkins | |
| 6,601,227 B1 | 7/2003 | Trimberger | |
| 6,604,228 B1 | 8/2003 | Patel et al. | |
| 6,611,951 B1 | 8/2003 | Tetelbaum et al. | |
| 2001/0049813 A1 | 12/2001 | Chan et al. | |
| 2003/0062922 A1 | 4/2003 | Douglass et al. | |
| 2004/0114638 A1* | 6/2004 | Matsuura et al. | 370/537 |
| 2004/0177162 A1* | 9/2004 | Wetzel et al. | 709/248 |

FOREIGN PATENT DOCUMENTS

| | | |
|---|---|---|
| EP | 0315275 A2 | 10/1989 |
| EP | 0 905 906 A2 | 3/1999 |
| EP | 1 235 351 A1 | 8/2002 |
| WO | WO 93 25968 A1 | 12/1993 |

OTHER PUBLICATIONS

Sayfe Kiaei et al., "VLSI Design of Dynamically Reconfigurable Array Processor-DRAP," IEEE, Feb. 1989, pp. 2484-2488, V3.6, IEEE, 3 Park Avenue, 17th Floor, New York, NY 10016-5997.

Vason P. Srini, "Field Programmable Gate Array (FPGA) Implementation of Digital Systems: An Alternative to ASIC," IEEE, May 1991, pp. 309-314, IEEE, 3 Park Avenue, 17th Floor, New York, NY 10016-5997.

G. Maki et al., "A Reconfigurable Data Path Processor," IEEE, Aug. 1991, pp. 18-4.1 to 18-4.4, IEEE, 3 Park Avenue, 17th Floor, New York, NY 10016-5997.

Jacob Davidson, "FPGA Implementation of Reconfigurable Microprocessor," IEEE, Mar. 1993, pp. 3.2.1-3.2.4, IEEE, 3 Park Avenue, 17th Floor, New York, NY 10016-5997.

Christian Iseli et al., "Beyond Superscaler Using FPGA's," IEEE, Apr. 1993, pp. 486-490, IEEE, 3 Park Avenue, 17th Floor, New York, NY 10016-5997.

P.C. French et al.,"A Self-Reconfiguring Processor,"; IEEE, Jul. 1993, pp. 50-59, IEEE, 3 Park Avenue, 17th Floor, New York, NY 10016-5997.

Christian Iseli et al., "Spyder: A Reconfigurable VLIW Processor Using FPGA's," IEEE, Jul. 1993, pp. 17-24, IEEE, 3 Park Avenue, 17th Floor, New York, NY 10016-5997.

Michael J. Wirthlin et al., "The Nano Processor: A Low Resource Reconfigurable Processor," IEEE, Feb. 1994, pp. 23-30, IEEE, 3 Park Avenue, 17th Floor, New York, NY 10016-5997.

William S. Carter, "The Future of Programmable Logic and Its Impact on Digital System Design," Apr. 1994, IEEE, pp. 10-16, IEEE, 3 Park Avenue, 17th Floor, New York, NY 10016-5997.

Andre' Dehon, "DPGA-Coupled Microprocessors: Commodity ICs for the Early 21st Century,"IEEE, Feb. 1994, pp. 31-39, IEEE, 3 Park Avenue, 17th Floor, New York, NY 10016-5997.

Osama T. Albaharna, "Area & Time Limitations of FPGA-Based Virtual Hardware," IEEE, Apr. 1994, pp. 184-189, IEEE, 3 Park Avenue, 17th Floor, New York, NY 10016-5997.

U.S. Appl. No. 10/043,769, filed Jan. 9, 2002, Schulz.

U.S. Appl. No. 10/001,871, filed Nov. 19, 2001, Douglass et al.

U.S. Appl. No. 09/991,412, filed Nov. 16, 2001, Herron et al.

Xilinx, Inc., "The Programmable Logic Data Book," 1994, Revised 1995, Xilinx, Inc., 2100 Logic Drive, San Jose, CA. 95124.

Xilinx, Inc., "The Programmable Logic Data Book," 1994, Revised 1995, pp. 2-109 to 2-117, Xilinx, Inc., 2100 Logic Drive, San Jose, CA. 95124.

Xilinx, Inc., "The Programmable Logic Data Book," 1994, Revised 1995, pp. 2-9 to 2-18; 2-187 to 2-199, Xilinx, Inc., 2100 Logic Drive, San Jose, CA. 95124.

Xilinx, Inc., "The Programmable Logic Data Book," 1994, Revised 1995, pp. 2-107 to 2-108, Xilinx, Inc., 2100 Logic Drive, San Jose, CA. 95124.

Christian Iseli et al., "AC++Compiler for FPGA Custom Execution Units Synthesis," 1995, pp. 173-179, IEEE, 3 Park Avenue, 17th Floor, New York, NY 10016-5997.

International Business Machines, "PowerPC 405 Embedded Processor Core User Manual," 1996, 5th Ed., pp. 1-1 TO X-16, International Business Machines, 1580 Rout 52, Bldg. 504, Hopewell Junction, NY 12533-6531.

Yamin Li et al., "AIZUP-A Pipelined Processor Design & Implimentation on Xilinx FPGA Chip," IEEE, Sep. 1996, pp. 98-106, 98-106, IEEE, 3 Park Avenue, 17th Floor, New York, NY 10016-5997.

Ralph D. Wittig et al., OneChip: An FPGA Processor With Reconfigurable Logic, Apr. 17, 1996, pp. 126-135, IEEE, 3 Park Avenue, 17th Floor, New York, NY 10016-5997.

Xilinx, Inc., "The Programmable Logic Data Book," Jan. 27, 1999, Ch. 3, pp. 3-1 TO 3-50, Xilinx, Inc., 2100 Logic Drive, San Jose, CA 95124.

William B. Andrew et al., "A Field Programmable System Chip Which Combines FPGA & ASIC Circuitry," IEEE, May 16, 1999, pp. 183-186, IEEE, 3 Park Avenue, 17th Floor, New York, NY 10016-5997.

Xilinx, Inc., "The Programmable Logic Data Book," 2000, Ch. 3 pp. 3-1 TO 3-117, Xilinx, Inc., 2100 Logic Drive, San Jose, CA 95124.

U.S. Appl. No. 09/991,410, filed Nov. 16, 2001, Herron et al.

U.S. Appl. No. 09/968,446, filed Nov. 16, 2001, Herron et al.

U.S. Appl. No. 09/917,304, filed Jul. 27, 2001, Douglass et al.

U.S. appl. No. 09/861,112, filed May 18, 2001, Dao et al.

Xilinx, Inc., "The Programmable Logic Data Book," 2000, Ch 3, pp. 3-7 to 3-17; 3-76 to 3-87, Xilinx, Inc., 2100 Logic Drive, San Jose, CA. 95124.

International Business Machines, "Processor Local Bus"Architecture Specifications, 32-Bit Implementation, Apr. 2000, First Edition, V2.9, pp. 1-76, IBM Corporation, Department H83A, P.O. Box 12195, Research Triangle Park, NC 27709.

Xilinx, Inc., Virtex II Platform FPGA Handbook, Dec. 6, 2000, v1.1, pp. 33-75, Xilinx, Inc., 2100 Logic Drive, San Jose, CA. 95124.

U.S. Appl. No. 09/858,732, filed May 5, 2001, Schulz.

Cary D. Snyder and Max Baron; "Xilinx's A-to-Z System Platform"; Cahners Microprocessor; The Insider's Guide to Microprocessor Hardware; Microdesign Resources; Feb. 6, 2001; pp. 1-5.

* cited by examiner

NETWORK PHYSICAL LAYER WITH EMBEDDED MULTI-STANDARD CRC GENERATOR

REFERENCE TO COMPACT DISC APPENDIX

The Compact Disc Appendix (CD Appendix), which is a part of the present disclosure, contains a hardware description language (Verilog code) description of receive and transmit modules of a network physical layer in accordance with an embodiment of the invention. A portion of the disclosure of this patent document contains material subject to copyright protection. The copyright owner of that material has no objection to the facsimile reproduction by anyone of the patent document or the patent disclosure, as it appears in the Patent and Trademark Office patent files or records, but otherwise reserves all copyright rights.

The Ethernet local area network (LAN) is one of the most popular and widely used computer networks in the world. Since the early 1970's, computer networking companies and engineering professionals have continually worked to improve Ethernet product versatility, reliability, and transmission speeds. To ensure that new Ethernet products were compatible, interoperable, and reliable, the Institute of Electrical and Electronic Engineers (IEEE) formed a standards group to define and promote industry LAN standards. Today, the IEEE 802.3 standards group is responsible for standardizing the development of new Ethernet protocols and products under an internationally well-known LAN standard called the "IEEE 802.3 standard."

Currently, there are a wide variety of standard Ethernet products used for receiving, processing, and transmitting data over Ethernet networks. By way of example, these networking products are typically integrated into networked computers, network interface cards (NICs), SNMP/RMON probes, routers, switching hubs, bridges and repeaters. To meet the demand for ever faster data transmission speeds, the IEEE 802.3 standards committee periodically introduces improved variations of the original IEEE 802.3 standard. For example, the "IEEE 802.3u standard" defines a system capable of transmitting data at speeds of up to about 100 Mbps and the "IEEE 802.3z standard" defines a system capable of transmitting data at speeds of up to 1 Gbps.

Figure 1:
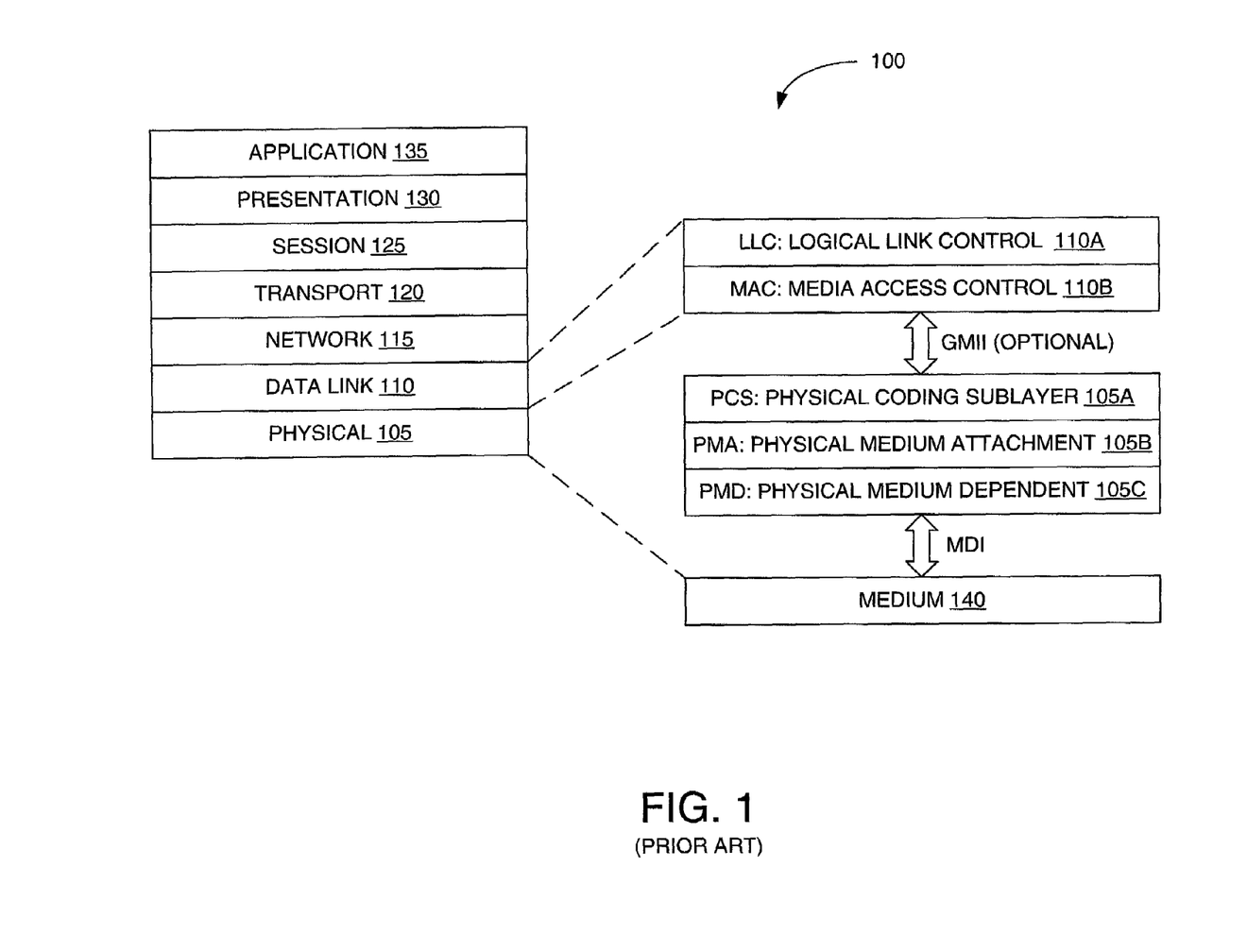
FIG. 1 is a diagrammatic representation of a conventional open systems interconnection (OSI) layered model 100 for describing the exchange of information between network layers.

FIG. 1 is a diagrammatic representation of a conventional open systems interconnection (OSI) layered model 100 developed by the International Organization for Standards (ISO) for describing the exchange of information between network layers. Though not all network standards follow OSI model 100—Fibre Channel is a notable exception—the OSI model is illustrative and useful for separating the technological functions of each layer.

OSI model 100 has as its lower-most layer a physical layer 105 that is responsible for encoding and decoding data into signals that are transmitted across a particular medium. As is well known in the art, physical layer 105 is also known as the "PHY layer." Above physical layer 105, a data link layer 110 provides reliable transmission of data over a network while performing appropriate interfacing with physical layer 105 and a network layer 115. Data link layer 110 generally includes a logical link control (LLC) layer 110A and a media access control (MAC) layer 110B. LLC layer 110A is generally a software function responsible for attaching control information to the data being transmitted from network layer 115 to MAC layer 110B. MAC layer 110B detects errors and schedules and controls the access of data to physical layer 105. In some cases, MAC layer 110B employs the well-known carrier sense multiple access with collision detection (CSMA/CD) algorithm. At the gigabit level and above, the CSMA/CD function has essentially been eliminated. MAC layer 110B is optionally connected to physical layer 105 via a Gigabit Medium Independent Interface (GMII).

Like data link layer 110, physical layer 105 includes multiple sublayers. A physical coding sublayer (PCS) 105A synchronizes and reformats data frames from link layer 110 into 10-bit code groups. A physical medium attachment (PMA) sublayer 105B serializes and transmits the code groups. PMA sublayer 105B deserializes data coming in from a communication medium 140 via a medium-dependent interface (MDI) and a physical medium dependent (PMD) layer 105C, and is additionally responsible for recovering the clock from incoming data streams.

Network layer 115 routes data between nodes in a network, and initiates, maintains, and terminates a communication link between users connected to those nodes. Transport layer 120 performs data transfers within a particular level of service quality. By way of example, a typical software protocol used for performing transport layer 120 functions may be TCP/IP, Novell IPX and NetBeui. Session layer 125 controls when users are able to transmit and receive data depending on whether the user is capable of full-duplex or half-duplex transmission, and also coordinates between user applications needing access to the network. Presentation layer 130 is responsible for translating, converting, compressing and decompressing data being transmitted across a medium. As an example, presentation layer 130 functions are typically performed by computer operating systems like Unix, DOS, Microsoft Windows, and Macintosh OS. Finally, Application layer 135 provides users with suitable interfaces for accessing and connecting to a network.

For more information on Ethernet network communication technology, reference may be made to issued U.S. patents entitled "Apparatus and Method for Full-Duplex Ethernet Communications" having U.S. Pat. Nos. 5,311,114 and 5,504,738, and "Media Access Control Micro-RISC Stream Processor and Method for Implementing the Same" having U.S. Pat. No. 6,172,990. These patents are incorporated herein by reference.

Figure 2:
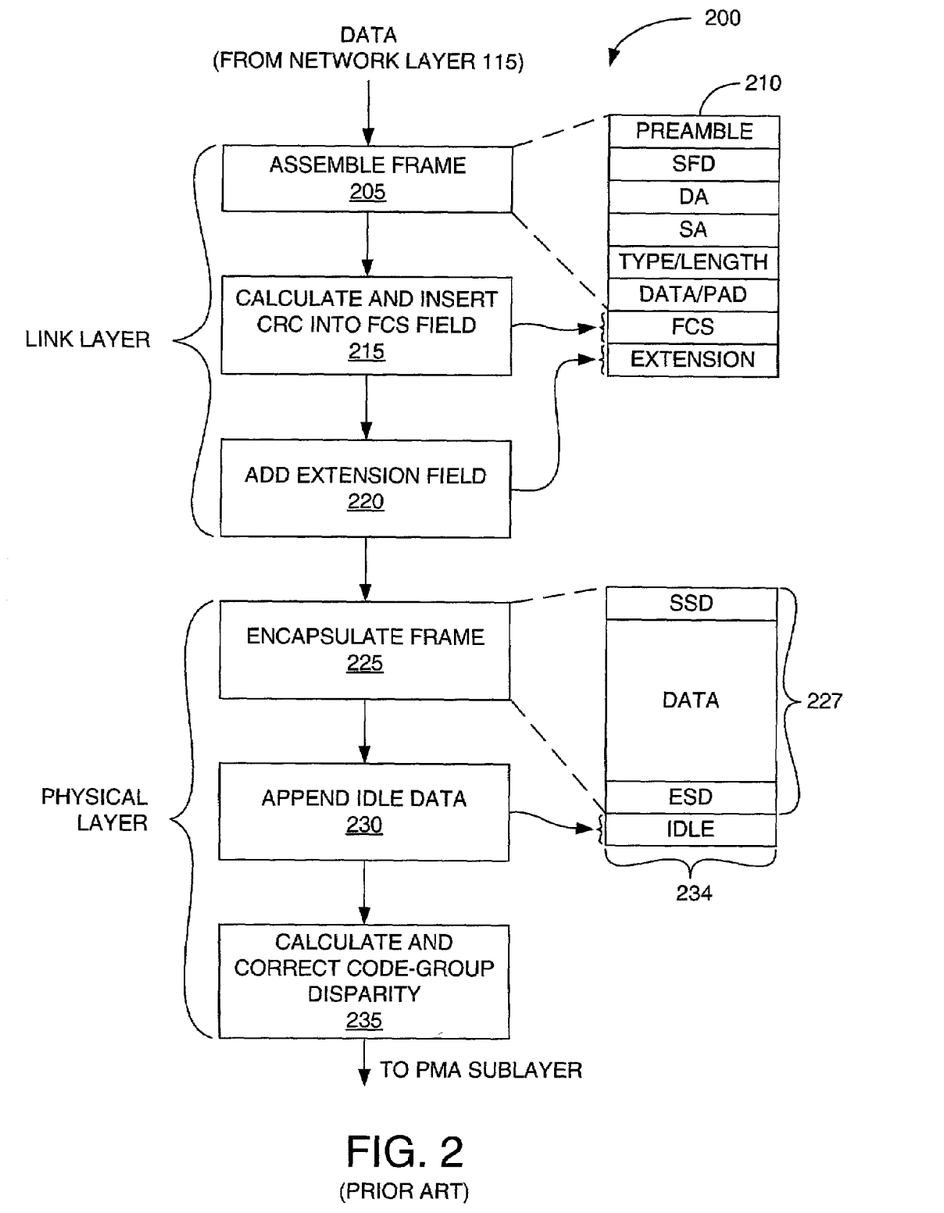
FIG. 2 is a flowchart 200 depicting the operation of portions of link layer 110 and physical layer 105 of FIG. 1 when transmitting a data frame.

FIG. 2 is a flowchart 200 depicting the operation of portions of link layer 110 and physical layer 105 of FIG. 1 when transmitting a data frame. Beginning at step 205, link layer 110 assembles data received from network layer 115 to create a data frame 210. Frame 210 generally includes a seven-byte preamble followed by a single-byte start frame delimiter (SFD). After the start frame delimiter, a six-byte destination address DA identifies the node that is to receive frame 210. A source address SA—also six bytes—follows the destination address DA. Next, a type/length field (typically 2 bytes) indicates the length and type of a data/pad field that follows. As is well known in the art, if a length is provided, the frame is classified as an 802.3 frame, and if the type field is provided, the frame is classified as an Ethernet frame. The data/pad field contains the data from network layer 115 divided into a sequence of octets (The word "octet" is an Ethernet word, also referred to as a "byte"). Correct CSMA/CD protocol requires a minimum frame size, which is specified by the particular implementation of the standard. If necessary, the data field is extended by appending extra bits (that is, a "pad") in units of octets after the data field.

Moving to step 215, link layer 110 performs a thirty-two-bit cyclic redundancy check (CRC) to calculate a CRC value. The CRC value is a function of the contents of frame 210 except for the preamble, SFD, FCS, and extension fields. The CRC value is then appended to frame 210 in a frame check sequence (FCS) field. Next, before passing the frame on to physical layer 105, the link layer optionally adds an extension field, which enforces the minimum carrier event duration in some operational modes.

PCS sublayer 105A accepts frame 210 from link layer 110 and encapsulates frame 210 (step 225) into a packet 227. In the art, packets like packet 227 are often referred to as "physical layer streams." In the present disclosure, the term "physical layer stream" refers to sequences of packets 227.

Properly formed, packet 227 includes a Start-of-Stream Delimiter (SSD), data code groups (DATA) corresponding to the data from the link layer, and an End-of-Stream Delimiter (ESD) (In some standards, the ESD can be replaced by a special SSD that can perform multiple functions. In the present disclosure, the placement of the delimiter defines whether it is a start-of-frame or end-of-frame delimiter). In addition, some standards specify that idle data IDLE be included in a physical layer stream between some packets 227. Each packet and associated idle data are collectively termed a "packet assembly" 234 for purposes of this disclosure.

The PCS sublayer calculates the running disparity for each packet assembly (step 235). Running disparity maintains an equivalence between the number of transmitted ones and zeros to keep the DC level balanced halfway between the "one" voltage level and the "zero" voltage level. Running disparity can be either positive or negative. In the absence of errors, the running disparity value is positive if, since power-on or reset, more ones have been transmitted than zeros, and is negative if more zeros have been transmitted than ones. The PCS sublayer adjusts the disparity and provides the disparity-adjusted physical layer stream to the PMA sublayer.

The entire link layer 110, and sometimes portions of physical layer 105, can be implemented using configurable logic in a programmable logic device (PLD), commonly a field-programmable gate array (FPGA). (For a more detailed treatment of one such embodiment, see the Xilinx Product specification entitled "1-Gigabit Ethernet MAC Core," Nov. 28, 2001, which is incorporated herein by reference.) Unfortunately, though a relatively simple function, the CRC circuitry in the link layer can occupy a significant portion of the available programmable resources, leaving fewer resources for other tasks. There is therefore a need for a more efficient means of facilitating network functionality in programmable logic.

The present invention is directed to methods and structures for transmitting and receiving data over a network. In an embodiment consistent with the OSI network model, the transmit and receive CRC generators are moved from the link layer to the physical layer. This modification frees up valuable programmable logic resources when a programmable logic device is employed to perform the functions of the link layer.

In one embodiment, the CRC generators of the physical layer are adapted to comply with a plurality of network communication standards. In yet another embodiment, the physical layer, including the CRC generators, is instantiated in hard logic on a programmable logic device. This embodiment offers a flexible and efficient solution for providing the physical and link layers on a single integrated circuit.

This summary does not define the scope of the invention, which is instead defined by the appended claims.

DETAILED DESCRIPTION

Figure 3:
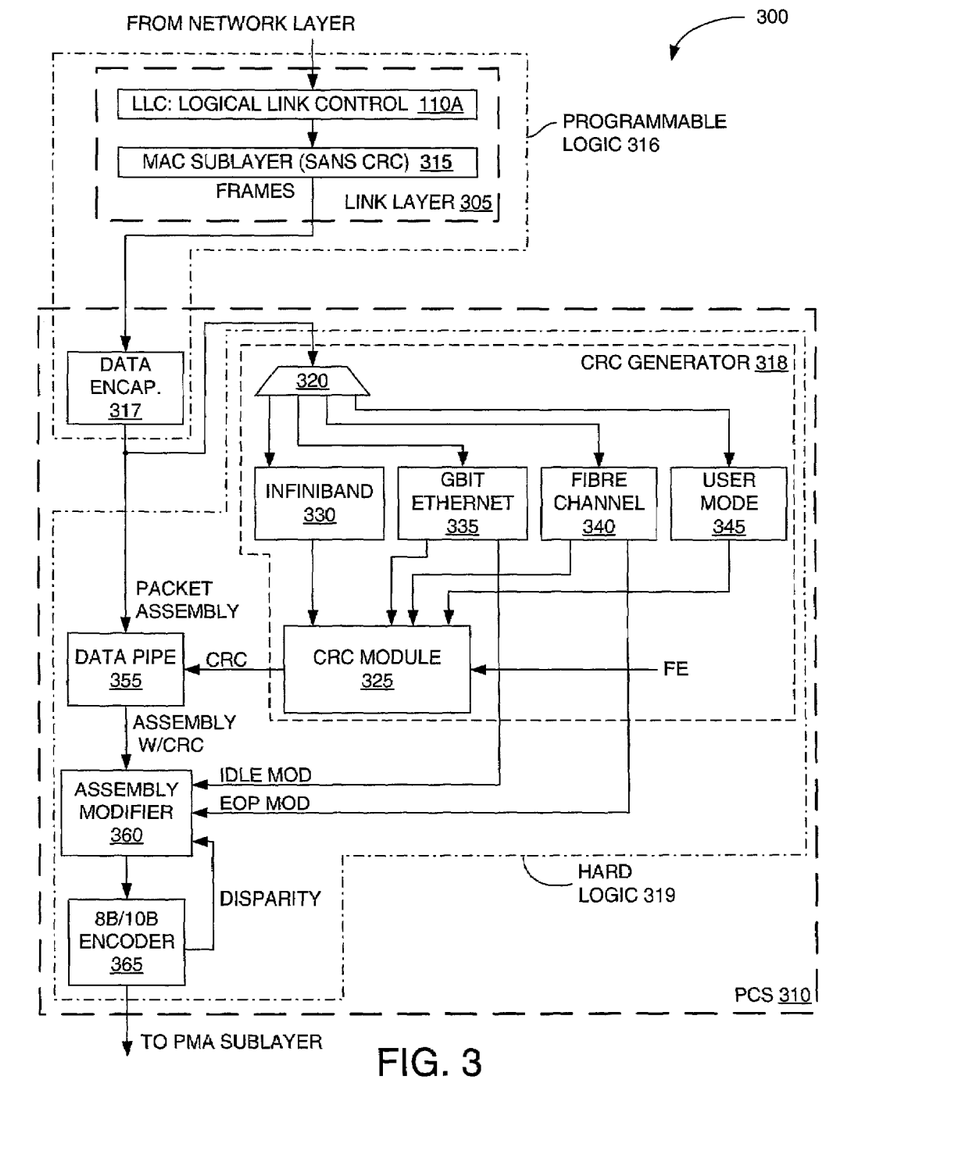
FIG. 3 depicts a portion of a network transmitter 300 in accordance with one embodiment of the invention.

FIG. 3 depicts a portion of a network transmitter 300 in accordance with one embodiment of the invention. Transmitter 300 only depicts a data link layer 305 and PCS layer 310 modified in accordance with embodiments of the present invention; the remaining layers and sublayers are identical to those discussed above in connection with FIGS. 1 and 2.

Data link layer 305 is, like the prior art, adapted to receive data from network layer 115 via an LLC sublayer 110A (FIG. 1). Data link layer 305 additionally includes a MAC sublayer 315 that does not calculate a CRC as is done in conventional MAC sublayers; instead, as will be discussed below in detail, CRC functions required by different network standards are performed in the physical layer by a modified PCS 310. In the depicted embodiment, link layer 305 is instantiated in programmable logic 316, but all or a portion may be "hardwired."

PCS 310 includes a data encapsulator 317 that encapsulates frames from MAC sublayer 315 in the manner described above in connection with FIG. 2. The encapsulation performed by data encapsulator 317 reformats frames into packets and, for some packets, inserts idle data. As noted previously, packets with associated idle data are collectively referred to herein as a "packet assembly." In the depicted embodiment, data encapsulator 317 is instantiated in programmable logic 316 with link layer 305, but data encapsulator 317 might also be hardwired.

In an embodiment that complies with the IEEE 802.3z standard, the idle data is a two-byte sequence in which the first byte is a K28.5 "comma" defined by the standard and the second byte renders the sequence either correcting or non-correcting. However, because the idle data depends upon the non-existent CRC value, in one embodiment data encapsulator 350 merely inserts, by default, the correcting form (or non-correcting form) of the idle data.

PCS 310, with the exception of data encapsulator 317, is instantiated in hard logic 319. PCS 310 includes a CRC generator 318, which in turn includes a programmable demultiplexer 320 adapted to provide the output of data encapsulator 317 to any of a number of data ports within PCS 310. Demultiplexer 320 can be programmed using memory cells (not shown) such as those commonly available on programmable logic devices.

CRC generator 318 additionally includes a CRC module 325 that receives data frames modified to comply with a number of communication standards. In the depicted embodiment, packets and packet assemblies from data encapsulator 317 can be routed via demultiplexer 320 to four different modules, each of which modifies the function of CRC module 325 to comply with a particular standard. The four modules include an InfiniBand™ module 330, a Gigabit Ethernet module 335, a Fibre Channel module 340, and a User-Mode module 345. Depending on the selected communication standard, as determined by programming demultiplexer 320, CRC module 325 calculates a CRC for each incoming frame embedded in a packet from data encapsulator 317 and inserts the resulting CRC value into the appropriate FCS field of the packet derived from the frame. InfiniBand™ module 330 works with CRC module 325 to perform a CRC in compliance with the specification entitled "InfiniBand™ Architecture Release 1.0.a," Jun. 19, 2001; Gigabit Ethernet module 335 works with CRC module 325 to perform a CRC in compliance with the IEEE 802.3z Gigabit Ethernet specification; and Fibre Channel module 340 works with CRC module 325 to perform a CRC in compliance with the Fibre Channel standard, as outlined in "Fibre Channel Overview," by Zoltán Meggyesi of the Research Institute for Particle and Nuclear Physics. Each of the foregoing documents is incorporated herein by reference. User module 345 can be adapted to perform a CRC in compliance with e.g. another standard.

CRC module 325 includes an optional force-error input line FE connected to an external, user-accessible pin (not shown). If line FE is held to a logic zero, module 325 provides the CRC value to data pipe 355 as described above. If, on the other hand, line FE is held to a logic one, module 325 corrupts the last byte of the CRC value to force a CRC error. Force-error line FE and related circuitry allow users to verify the operation of CRC module 325.

In one embodiment, module 325 corrupts the CRC value by XORing each bit of the last byte of the CRC value with a logic one to produce a corrupt CRC value in which each bit of the last byte is inverted. In another embodiment, users can configure inputs to the XOR function to be either ones or zeros, and can therefore determine which bits of the last byte are inverted. In still other embodiments, the last byte is replaced with a fixed value or one of two or more alternative values.

Positioning CRC generator 318 within the physical layer in hard logic minimizes the amount of circuitry required to cover multiple standards. CRC module 325 is reasonably similar for each of the standards, only requiring minor modifications via modules 330, 335, 340, and 345. For example, the Gigabyte Ethernet standard runs all frame bits through CRC module 325 to create a CRC value, while the InfiniBand™ standard, depending upon the packet, masks out some bits before performing the CRC. The different modules account for such differences, but each relies on the same function performed by CRC module 325.

PCS 310 cannot determine whether to send the correcting or the non-correcting form of the idle data until the disparity for the entire packet assembly is known, but the disparity cannot be calculated until the CRC value is in place within the packet. Data pipe 355 receives the packet assembly, sans the CRC value, from data encapsulator 317 and then inserts into the FCS field of the associated packet the CRC value calculated by CRC module 325. Data pipe 355 then conveys the packet assembly with the potentially erroneous idle data to packet-assembly modifier 360. 8B/10B encoder 365 calculates the running disparity on the resulting packet assembly and conveys the disparity to assembly modifier 360, which modifies the packet assembly, if necessary, to provide the appropriate one of the correcting or non-correcting forms. In the case of a system employing the Gigabyte Ethernet standard, the disparity should be negative before transmitting data from the physical layer, so packet-assembly modifier 360 modifies the idle data to the correcting form in the event that the disparity is positive.

Figure 4:
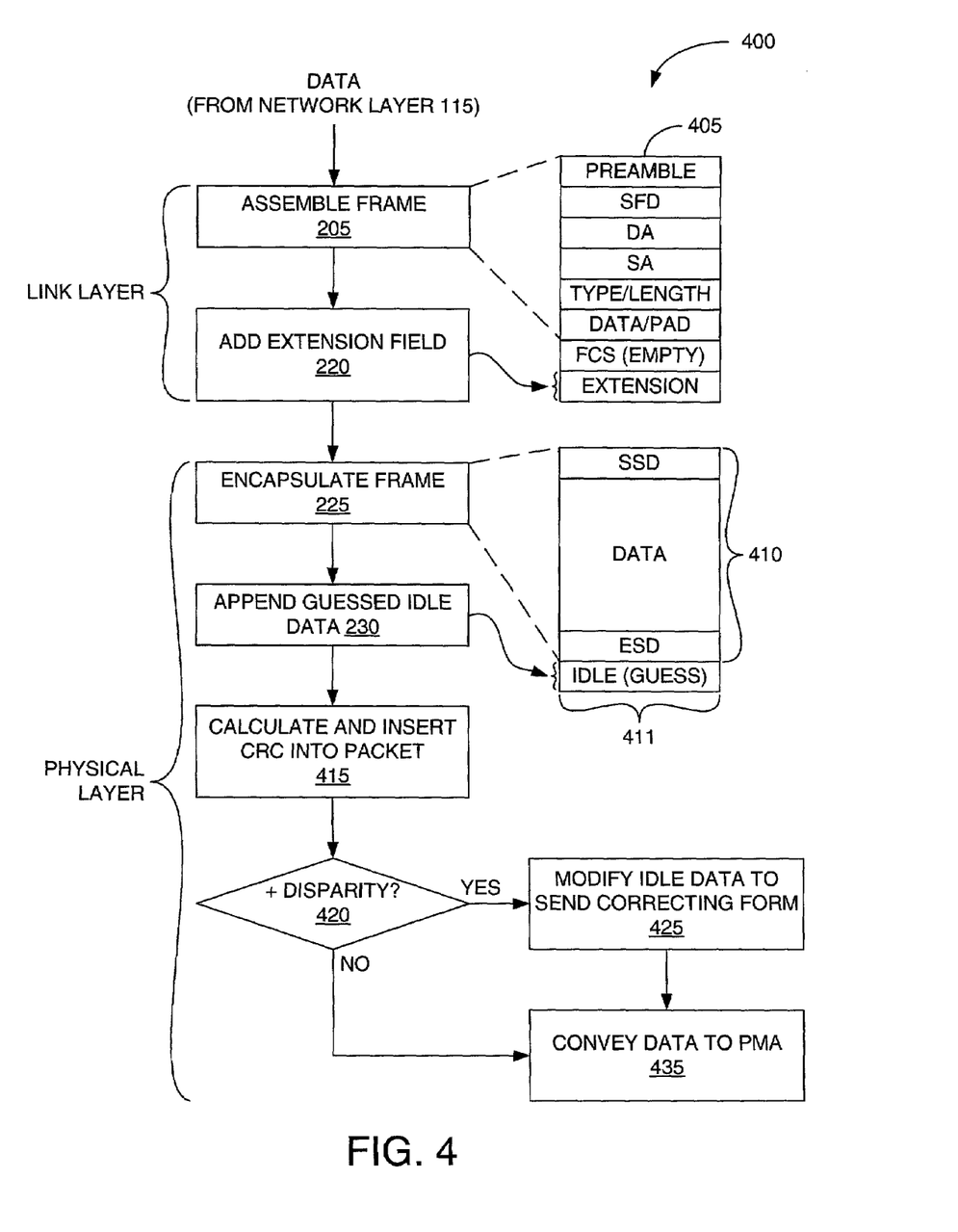
FIG. 4 is a flow chart 400 describing the sequence of steps performed by the link layer and the physical layer of an embodiment that complies with the Gigabyte Ethernet standard.

FIG. 4 is a flow chart 400 describing the sequence of steps performed by link layer 305 and PCS sublayer 310 of an embodiment that complies with the Gigabyte Ethernet standard. Link layer 305 assembles each frame received from the MAC client (step 205) in the manner described above in connection with FIG. 2. Link layer 305 also adds an extension field (step 220), also in the manner discussed above. Different from the process described above, link layer 305 does not calculate a CRC value for insertion in the FCS field of frame 405. Instead, MAC sublayer 305 sends the frame without a CRC value, and with or without a CRC field. In one embodiment, MAC sublayer 305 adds four extra bytes onto the frame and then sends the frame normally. In this case, the four extra bytes are merely placeholders for the CRC: their contents do not matter.

Next, data encapsulator 317 encapsulates the resulting frame 405 in the manner discussed above in connection with FIG. 2 (step 225) and appends idle data to the resulting packet 410 to form a packet assembly 411. The correct form of the idle data must be "guessed," because the Gigabyte Ethernet standard requires the idle data be a function of the CRC value, and the CRC value has yet to be calculated. CRC module 325 inserts the calculated CRC value into packet 410 (step 415). In the Gigabit Ethernet standard, the idle data comprises a two-byte sequence in which the first byte is a K28.5 "comma" character and the second byte makes the sequence correcting or non-correcting. The K28.5 comma can be positive (bit sequence 0011111010) or negative (bit sequence 1100000101). Encoder 365 sends the positive comma if the disparity is negative, and sends the negative comma if the disparity is positive. However, minus commas or sequences of minus commas are not recognized by many Gigabit-Ethernet compliant devices, and thus should be sent as seldom as possible. For example, the Gigabit Ethernet specification requires the minus comma be sent at most once per collection of idle data. Subsequent commas associated with the same packet assembly must be plus commas. Consequently, packet-assembly modifier 360 determines whether the disparity is positive (decision 420) and, if so, modifies packet assembly 411 to include a correcting form of the idle data (step 425). If the disparity is not positive, then packet-assembly modifier 360 leaves the idle data as is. In either case, encoder 365 conveys the resulting correct packet assembly to the PMA sublayer (step 435). The remaining transmission sequence is conventional, and is therefore omitted for brevity.

For more detailed discussion of link and physical layers of the prior art, see IEEE standard 802.3, 2000 edition, entitled, "Part 3: Carrier Sense Multiple Access with Collision Detection (CSMA/CD) Access Method and Physical Layer Specifications," which is incorporated herein by reference.

The Fibre Channel standard also discourages transmission of "negative commas." Instead of modifying the idle data, however, modifier 360 is adapted to modify the ESD field of packet 410 to correct for a positive disparity. The InfiniBand™ standard does not require either an idle modifier or an end-of-packet modifier.

Figure 5:
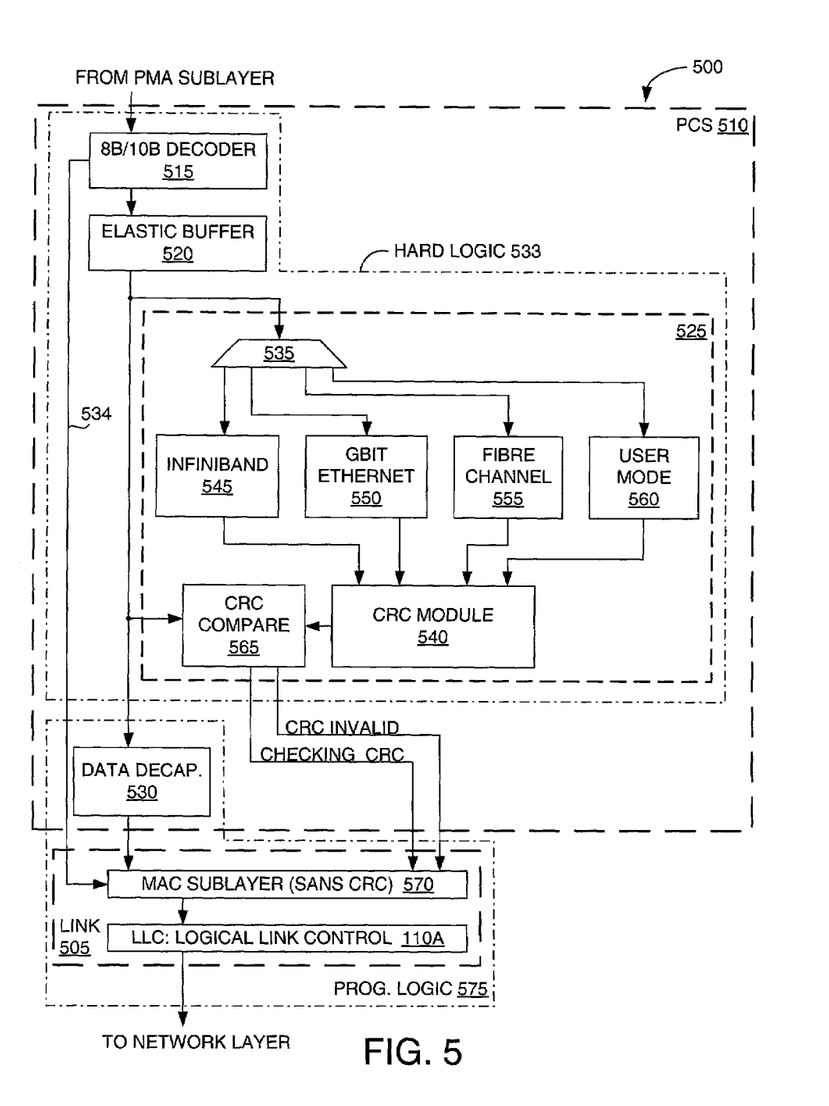
FIG. 5 depicts a portion of a network receiver 500 in accordance with one embodiment of the invention.

FIG. 5 depicts a portion of a network receiver 500 in accordance with one embodiment of the invention. Receiver 500 only depicts a data link layer 505 and a PCS layer 510 modified in accordance with embodiments of the present invention; the remaining layers and sublayers are identical to those discussed above in connection with FIGS. 1 and 2. In one embodiment, data link layers 305 and 505 are portions of the same link layer, and PCS sublayers 310 and 510 are portions of the same PCS sublayer.

PCS sublayer 510 includes a 8B/10B decoder 515, an elastic buffer 520, a CRC generator 525, and a data decapsulator 530. In the depicted embodiment, all these elements except for data decapsulator 530 are instantiated in hard logic 533, though this need not be the case.

8B/10B decoder 515 (sometimes referred to as an "10B/8B decoder") conventionally receives and decodes data from a PMA sublayer and conveys the resulting decoded packet assemblies to elastic buffer 520. Also conventional, decoder 515 identifies some types of packet errors and alerts MAC sublayer 570 of erroneous packets via e.g. an error line 534.

Elastic buffer 520 is a conventional buffer with adjustable data capacity; in one embodiment, buffer 520 can hold up to 64 bytes of data, an amount sufficient to comply with each of the above-mentioned standards. Buffer 520 forwards packet assemblies to CRC generator 525 and data decapsulator 530.

CRC generator 525 includes a programmable demultiplexer 535 that provides packet assemblies from buffer 520 to any of a number of data ports within PCS 510. PCS 510 additionally includes a CRC module 540 that receives data from one of four sources. In the depicted embodiment, packet assemblies from buffer 520 can be routed via demultiplexer 535 to four different modules, each of which modifies the function of CRC module 540 to comply with a particular standard. The four modules include an InfiniBand™ module 545, a Gigabit Ethernet module 550, a Fibre Channel module 555, and a User-Mode module 560. Depending on the selected communication standard, as determined by programming demultiplexer 535, CRC module 540 calculates a CRC value for each incoming packet assembly. This CRC value depends on the same fields for which the previously mentioned CRC value was calculated in the foregoing discussion of FIGS. 3 and 4.

CRC generator 525 includes a CRC compare module 565 that strips the CRC value from each packet assembly and compares the stripped CRC value with the calculated CRC value from CRC module 540. During the comparison process, CRC compare module 565 alerts link layer 505 by asserting a signal "checking CRC." In the event of a mismatch between the stripped and calculated CRC values, CRC compare module 565 generates an error signal to link layer 505 by pulling a line CRC INVALID high (i.e., to a logic one).

Data decapsulator 530 conventionally strips headers and removes idle data from incoming packet assemblies to reproduce data frames. The frames are then conveyed to a MAC sublayer 570 within link layer 505. As with MAC sublayer 315 of transmitter 300 (FIG. 3), MAC sublayer 570 does not calculate a CRC value; instead, as noted above, the CRC functions required by different network standards are performed in hard logic in PCS sublayer 510. Similar to the transmitter case, positioning CRC module 525 within the physical layer minimizes the amount of programmable resources required to implement the CRC function.

As is conventional, MAC sublayer 570 "flushes" erroneous packets, whether those packets are identified by decoder 515 or by a CRC mismatch. Unlike conventional MAC sublayers, however, MAC sublayer 570 relies upon CRC generator 525 to find CRC errors. In the depicted embodiment, MAC sublayer 570 has no control over whether CRC module 525 performs a CRC on incoming packets, so receiver 500 performs a CRC on each packet regardless of whether decoder 515 identifies an error. The absence of MAC-sublayer control places CRC generator 525 outside of the conventional boundary of the link layer.

Figure 6:
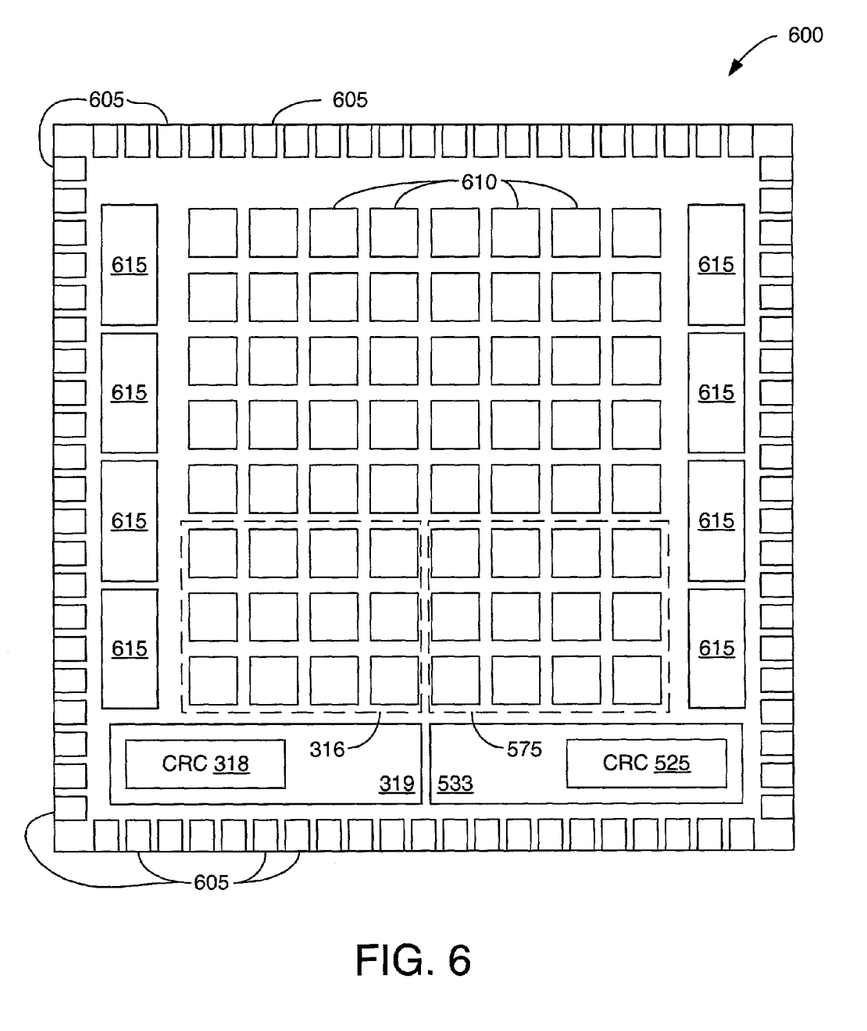
FIG. 6 depicts an FPGA 600 adapted in accordance with an embodiment of the invention to include network transmitter 300 of FIG. 3 and network receiver 500 of FIG. 5.

FIG. 6 depicts an FPGA 600 adapted in accordance with an embodiment of the invention to include network transmitter 300 of FIG. 3 and network receiver 500 of FIG. 5. As is conventional, FPGA 600 includes a collection of programmable logic, including a plurality of input/output blocks (IOBS) 605, an array of configurable logic blocks (CLBS) 610, and a plurality of block RAMs 615. CLBs 610 are the primary building blocks and contain elements for implementing customizable gates, flip-flops, and wiring; IOBs 605 provide circuitry for communicating signals with external devices; and block RAMs 615 allow for synchronous or asynchronous data storage, though each CLB can also implement synchronous or asynchronous RAMs. Some of IOBs 605 may be optimized, as necessary, to support high-speed communication. For a detailed treatment of one FPGA, see the Xilinx advance product specification entitled "Virtex-II 1.5V Field-Programmable Gate Arrays," DS031-2 (v1.9), Nov. 29, 2001, which is incorporated herein by reference.

In addition to conventional features, FPGA 600 includes hardwired (i.e., application specific) logic 319 (FIG. 3) and 533 (FIG. 5), which respectively include CRC generators 318 and 525. Data link layer 305 and data link layer 505 are instantiated within programmable logic 316 and 575, respectively, using a plurality of CLBs 610.

While the present invention has been described in connection with specific embodiments, variations of these embodiments will be obvious to those of ordinary skill in the art. For example, many of the elements instantiated in programmable logic can be instantiated instead in hard logic, and vice versa. Therefore, the spirit and scope of the appended claims should not be limited to the foregoing description.

What is claimed is:

1. A method of transmitting network data, the method comprising:

assembling the data into a plurality of data frames in a link layer implemented in programmable logic of an integrated circuit;

encapsulating the plurality of data frames into data packets in a physical layer implemented in application-specific logic of the integrated circuit, each data packet having a start field identifying the start of the packet and a data field including a data frame;

appending idle data to each data packet in the physical layer to form packet assemblies;

performing, for each packet assembly, a cyclic redundancy check (CRC) of the data frame in a sublayer of the physical layer separate from a physical layer interface to obtain a CRC value; and adding, for each packet assembly, a CRC value to the data packet in a sublayer of the physical layer.

2. The method of claim 1, further comprising:

evaluating each packet assembly to obtain a disparity value; and if the disparity value for a packet assembly indicates an incorrect disparity, changing the packet assembly.

3. The method of claim 2, wherein changing the packet assembly comprises changing the idle data.

4. The method of claim 2, wherein each data packet includes an end-of-packet field, and wherein changing the packet assembly comprises changing the end-of-packet field.

5. The method of claim 1, wherein the idle data comprises a comma character.

6. The method of claim 5, wherein the comma character includes five consecutive identical bits.

7. The method of claim 6, wherein the five consecutive identical bits are logic zeros.

8. The method of claim 1, wherein appending the idle data occurs before performing the CRC of the data frame.

9. The method of claim 1, further comprising adding an extension field to a data frame before encapsulating the data frame into a data packet.

10. The method of claim 1, further comprising programming programmable logic to assemble the data into a plurality of data frames.

11. The method of claim 10, wherein the programmable logic does not perform the CRC.

12. The method of claim 10, wherein the CRC is performed using application-specific logic.

13. A network physical layer coupled to transmit data frames in a programmable logic device and instantiated in application-specific logic of the programmable logic device, the physical layer comprising:
a data node coupled to receive a plurality of data packets from a link layer implemented in programmable logic of the programmable logic device, each data packet including a data frame; and
a CRC generator in a sublayer of the physical layer separate from a physical layer interface and coupled to the data node to perform a CRC, for each data packet, on the data frame to provide a CRC value and to insert the CRC value into the data packet.

14. The physical layer of claim 13, wherein the data node is further coupled to receive idle data.

15. The physical layer of claim 14, wherein a data packet and idle data collectively form a packet assembly, the physical layer further comprising an encoder coupled to receive the packet assembly and to provide a disparity value that is a function of the packet assembly.

16. The physical layer of claim 15, further comprising a packet-assembly modifier connected to the encoder and coupled to receive the disparity value and to modify the packet assembly in response to the disparity value.

17. The physical layer of claim 16, wherein the packet-assembly modifier outputs a modified packet assembly having modified idle data.

18. The physical layer of claim 16, wherein the disparity value may be positive or negative.

19. The physical layer of claim 18, wherein the packet-assembly modifier modifies the idle data in response to the positive disparity value.

20. The physical layer of claim 18, wherein the packet-assembly modifier leaves unmodified the idle data in response to the negative disparity value.

21. The physical layer of claim 13, wherein the CRC generator further comprises a first module enabling a first communication standard and a second module enabling a second communication standard.

22. The physical layer of claim 13, wherein the CRC generator further comprises a force-error input terminal.

23. The physical layer of claim 22, wherein the force-error input terminal is coupled to receive a test signal for inducing the CRC generator to produce an error.

24. A programmable logic device comprising:
an array of configurable logic blocks comprising a link layer implemented in programmable logic for transmitting network data; and
a network physical layer instantiated in hard logic and coupled to receive network data comprising a plurality of data frames from the link layer;
wherein the physical layer comprises a CRC generator performing a cyclic redundancy check on each data frame of the plurality of data frames in a sublayer of the physical layer separate from a physical layer interface.

25. The programmable logic device of claim 24, wherein the CRC generator performs a plurality of CRC functions to support a plurality of communication standards.

26. The programmable logic device of claim 24, further comprising a data encapsulator coupled to receive a data frame and provide a data packet based on the data frame, wherein the CRC generator performs a CRC on at least a portion of the data frame to obtain a CRC value and to insert the CRC value into the data packet.

27. The programmable logic device of claim 26, wherein the data encapsulator adds idle data to the packet to form a packet assembly, the programmable logic device further comprising a packet-assembly modifier coupled to modify the packet assembly based in part on the CRC value.

28. The programmable logic device of claim 27, wherein the packet-assembly modifier modifies the idle data.

29. The programmable logic device of claim 24, wherein the CRC generator further comprises a force-error input terminal.

30. The programmable logic device of claim 29, wherein the force-error input terminal is coupled to receive a test signal for inducing the CRC generator to produce an error.

31. A network receiver coupled to receive data and instantiated in application-specific logic of a programmable logic device, the network receiver comprising a physical layer having a data node coupled to receive a plurality of packet assemblies from a link layer implemented in programmable logic of the programmable logic device, each packet assembly including a data frame, and a CRC generator, wherein the CRC generator is implemented in a sublayer of the physical layer separate from a physical layer interface and performs, for each packet assembly, a CRC on at least a portion of the packet assembly to provide a calculated CRC value.

32. The network receiver of claim 31, wherein each packet assembly includes a packet CRC value, the physical layer further comprising a CRC compare circuit comparing the packet CRC value to the calculated CRC value.

33. The network receiver of claim 32, wherein the link layer is connected to the CRC compare circuit.

34. The network receiver of claim 33, wherein the CRC compare circuit of the physical layer identifies mismatches between the packet CRC value and the calculated CRC value for the link layer.

35. The network receiver of claim 33, wherein the link layer rejects defective packets, and wherein the link layer relies upon the CRC compare circuit in the physical layer to identify the defective packets.

36. The network receiver of claim 31 wherein the CRC generator performs a plurality of CRC functions to support a plurality of communication standards.

37. A system, comprising:
a network; and
a transmitter coupled to the network and transmitting a plurality of data frames to the network, the transmitter comprising a physical layer implemented in hard logic and a link layer implemented using programmable logic, the link layer being coupled between the physical layer and the network, the physical layer comprising:
a data node coupled to receive a plurality of data packets, each data packet including a data frame; and
a CRC generator implemented in a sublayer of the physical layer separate from a physical layer interface and coupled to the data node to perform, for each data packet, a CRC on the data frame to provide a CRC value and to insert the CRC into the data packet.

38. The system of claim 37, wherein the link layer and the physical layer of the transmitter each comprise portions of a programmable logic device (PLD).

39. The system of claim 38, wherein the PLD is a field programmable gate array (FPGA).

40. The system of claim 37, further comprising:
a receiver coupled to the network and coupled to receive data from the network, the receiver being implemented in hard logic, the receiver having a physical layer comprising:
a data node coupled to receive a packet assembly from the network, the packet assembly including at least a portion of the data; and
a CRC generator coupled to the data node to perform a CRC on at least a portion of the packet assembly to provide a calculated CRC value.

41. The system of claim 40, wherein the link layer and the physical layer of the transmitter, and the physical layer and CRC generator of the receiver, each comprise portions of a programmable logic device (PLD).

42. The system of claim 41, wherein the PLD is a field programmable gate array (FPGA).

43. A system, comprising:
a network; and
a receiver coupled to the network to receive data from the network, the receiver being implemented in a programmable logic device, the receiver comprising:
a data node coupled to receive a plurality of packet assemblies from the network, each packet assembly including a data frame, and having a CRC generator implemented in a sublayer of the physical layer separate from a physical layer interface to perform a CRC, for each packet assembly, on at least the data frame to provide a calculated CRC value, wherein the data node and the CRC generator are implemented in hard logic; and
a link layer implemented in programmable logic of the programmable logic device.

44. The system of claim 43, wherein the physical layer and CRC generator of the receiver each comprise portions of a programmable logic device (PLD).

45. The system of claim 44, wherein the PLD is a field programmable gate array (FPGA).

* * * * *